United States Patent
Yao et al.

(10) Patent No.: US 12,051,522 B2
(45) Date of Patent: Jul. 30, 2024

(54) SILVER SINTERING COMPOSITION CONTAINING COPPER ALLOY FOR METAL BONDING

(71) Applicant: Henkel AG & Co., KGaA, Dusseldorf (DE)

(72) Inventors: Wei Yao, Shanghai (CN); Yang Ti, Shanghai (CN); Jaiwen Zhao, Shanghai (CN); Qili Wu, Shanghai (CN)

(73) Assignee: HENKEL AG & CO. KGaA, Duesseldorf (DE)

( * ) Notice: Subject to any disclaimer, the term of this patent is extended or adjusted under 35 U.S.C. 154(b) by 71 days.

(21) Appl. No.: 17/807,407

(22) Filed: Jun. 17, 2022

(65) Prior Publication Data
US 2022/0319733 A1    Oct. 6, 2022

Related U.S. Application Data

(63) Continuation of application No. PCT/CN2019/126894, filed on Dec. 20, 2019.

(51) Int. Cl.
| | |
|---|---|
| *H01B 1/22* | (2006.01) |
| *B22F 1/052* | (2022.01) |
| *B22F 1/10* | (2022.01) |
| *H01L 23/00* | (2006.01) |
| *B22F 1/0545* | (2022.01) |
| *B22F 1/102* | (2022.01) |
| *B22F 1/107* | (2022.01) |

(52) U.S. Cl.
CPC ............... *H01B 1/22* (2013.01); *B22F 1/052* (2022.01); *B22F 1/10* (2022.01); *H01L 24/29* (2013.01); *B22F 1/0545* (2022.01); *B22F 1/102* (2022.01); *B22F 1/107* (2022.01); *B22F 2301/10* (2013.01); *B22F 2301/255* (2013.01); *H01L 2224/2929* (2013.01); *H01L 2224/29294* (2013.01); *H01L 2224/29311* (2013.01); *H01L 2224/29339* (2013.01); *H01L 2224/29347* (2013.01); *H01L 2924/0132* (2013.01); *H01L 2924/0665* (2013.01); *Y10T 428/12014* (2015.01)

(58) Field of Classification Search
None
See application file for complete search history.

(56) References Cited

U.S. PATENT DOCUMENTS

| | | | |
|---|---|---|---|
| 5,221,038 | A | 6/1993 | Melton et al. |
| 5,853,622 | A | 12/1998 | Gallagher et al. |
| 5,964,395 | A | 10/1999 | Glovatsky et al. |

(Continued)

FOREIGN PATENT DOCUMENTS

| | | |
|---|---|---|
| CN | 101770829 A | 7/2010 |
| CN | 104575686 A | 4/2015 |

(Continued)

OTHER PUBLICATIONS

Extended European Search Report for EP Application No. 19956672.0 dated Sep. 15, 2023; 6 pages.

*Primary Examiner* — Seth Dumbris
(74) *Attorney, Agent, or Firm* — Sun Hee Lehmann

(57) ABSTRACT

This invention relates to a silver sintering composition. In particular, the present invention relates to a silver sintering composition containing a copper alloy, which is capable of being stably sintered on various metal substrates such as copper, gold or silver with good adhesion and sintering strength.

19 Claims, 2 Drawing Sheets

(56) References Cited

U.S. PATENT DOCUMENTS

| | | | |
|---|---|---|---|
| 6,241,145 | B1 | 6/2001 | Maeda et al. |
| 10,000,670 | B2 | 6/2018 | Kuder et al. |
| 10,446,518 | B2 | 10/2019 | Inoue et al. |
| 2007/0164260 | A1* | 7/2007 | Kuwajima ............ H05K 1/095 |
| | | | 252/512 |
| 2007/0278683 | A1* | 12/2007 | Santos .................. H01L 24/27 |
| | | | 257/E21.705 |
| 2013/0187102 | A1* | 7/2013 | Kuder ....................... C09J 9/02 |
| | | | 252/514 |
| 2017/0294404 | A1* | 10/2017 | Inoue ........................ B22F 7/08 |
| 2018/0237618 | A1* | 8/2018 | Mu .......................... C08K 9/02 |

FOREIGN PATENT DOCUMENTS

| | | |
|---|---|---|
| CN | 104641423 A | 5/2015 |
| CN | 107735854 A | 2/2018 |
| CN | 108526751 A | 9/2018 |
| CN | 109509568 A | 3/2019 |
| EP | 0470262 A1 | 2/1992 |
| EP | 0474879 A1 | 3/1992 |
| JP | 2018502455 A | 1/2018 |
| JP | 6556302 B1 | 8/2019 |
| KR | 20140094690 A | 7/2014 |
| WO | 2014112683 A1 | 7/2014 |
| WO | 2016103528 A1 | 6/2016 |

\* cited by examiner

SILVER SINTERING COMPOSITION CONTAINING COPPER ALLOY FOR METAL BONDING

TECHNICAL FIELD

The present invention relates to a silver sintering composition, particularly relates to a silver sintering composition containing a copper alloy for metal bonding, the sintered product, the assembly and the use thereof.

BACKGROUND OF THE INVENTION

There is an ever-increasing need in the electronics industry for interconnect materials that can be applied to high processing and operating temperatures. Historically, lead (Pb) based solders have been used to attach components to electronic circuit boards or to attach external leads to the electronic components. More recently, the use of hazardous substances in electrical and electronic equipment, as typified by the European RoHS legislation, has restricted the use of lead (Pb) in solder which has led the industry to seek various alternatives.

One of present solution is transient liquid phase sintering (TLPS). TLPS adhesives have been developed for many potential applications due to various advantages like lead free, flux-less and particularly their low temperature processability, which enables the use of heat sensitive components in the design. The following patents describe the materials and processes of TLPS with respect to forming a conductive bond.

U.S. Pat. No. 5,853,622 discloses TLPS formulations which combine TLPS materials with cross linking polymers to create a conductive adhesive having improved electrical conductivity as a result of intermetallic interfaces between the metal surfaces created by TLPS process.

U.S. Pat. No. 5,964,395 discloses the spraying of two mating surfaces, with one surface having a low temperature melting material and the mating surface having a compatible higher melting temperature material forms a joint when heating to the melting point of the lower temperature material.

U.S. Pat. No. 5,221,038 describes the use of SnBi or SnIn for soldering discrete components such as resistors and the like to printed circuit boards using the TLPS process.

U.S. Pat. No. 6,241,145 discloses the use of Ag/SnBi coated to two mating surfaces to mount electronic modules to substrates.

However, TLPS is still problematic because it is brittle and produces void in the cured product bonding the substrate. Alternatively, silver sintering compositions comprising resin and conductive fillers are used in the fabrication and assembly of semiconductor packages and microelectronic devices, both to mechanically attach, and to create electrical and thermal conductivity between integrated circuit devices and their substrates. The most commonly used conductive filler is silver flake. Adhesive resins are used in the conductive compositions because silver flake typically does not sufficiently adhere semiconductor or microelectronic devices to their substrate. The presence of the resin, however, limits the high thermal and electrical conductance of the silver.

Currently, conductive compositions having silver filler in no presence of resin can be adhered with thermo-compression bonding, or no pressure bonding, to silver or gold substrates. However, the adhesion strength is not satisfactory. Moreover, substrates commonly used in the fabrication of electronic devices are copper lead-frames, while silver conductive composition does not readily form an intermetallic bond to copper. In high power and high temperature applications, they fail when they are cycled at temperature which closes to its melting point. Other disadvantage is that such composition requires fluxing agents, which leaves flux residues after the inter-metallic bond is formed, thus necessitating a cleaning step for the substrate during the manufacturing process.

Therefore, silver sintering compositions with or without resin all have their limitation in the fabrication and assembly of semiconductor packages and microelectronic devices. Consequently, there remains a need to develop a Pb-free silver sintering composition which is capable of stably sintering on various metal substrates such as copper, gold or silver, particularly copper with good adhesion and sintering strength.

SUMMARY OF THE INVENTION

After intensive studies, the inventors have found that the above problems can be solved by a silver sintering composition comprising:

(A) at least one silver filler, (B) at least one copper alloy in an amount of from 0.01% to 20% by weight, based on the total weight of the composition, and (C) a matrix component selected from a resin, a solvent, and a combination thereof.

The silver sintering composition of this invention is capable of stably sintering on various metal substrates such as copper, gold or silver, particularly copper with good adhesion and sintering strength.

In another aspect of the invention, sintered product of the conductive composition according to this invention is provided.

In an additional aspect of the invention, an assembly a first substrate of silver, a sintered product according to this invention, and a second substrate selected from copper, gold or silver, wherein sintered product is dispensed between the first substrate and the second substrate is provided.

In yet another aspect of the invention, the use of the conductive composition of this invention in the manufacturing of semiconductor packages and microelectronic devices touch screen is provided.

In yet another aspect of the invention, the use of the sintered product of this invention in semiconductor packages and microelectronic devices touch screen is provided.

DETAILED DESCRIPTION OF THE INVENTION

Figure 1:
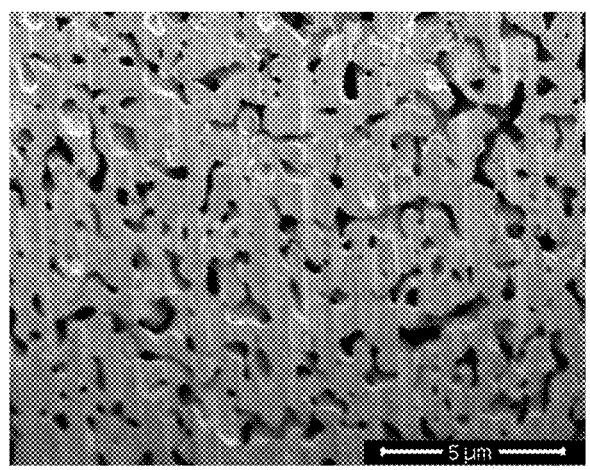
FIG. 1 shows a scanning electron microscope (SEM) photo with the magnification ratio of 5000 of cell structure of the silver sintering composition according to Example 1.

It is to be understood by one of ordinary skill in the art that the present invention is a description of exemplary embodiments only and is not intended as limiting the broader aspects of the present invention. Each aspect so described may be combined with any other aspect or aspects unless clearly indicated to the contrary. In particular, any feature indicated as being preferred or advantageous may be combined with any other feature or features indicated as being preferred or advantageous.

Unless specified otherwise, in the context of the present invention, the terms used are to be construed in accordance with the following definitions.

Unless specified otherwise, as used herein, the terms "a", "an" and "the" include both singular and plural referents.

The terms "comprising" and "comprises" as used herein are synonymous with "including", "includes" or "containing", "contains", and are inclusive or open-ended and do not exclude additional, non-recited members, elements or process steps.

The term "alloy" refers to a mixture containing two or more metals, and optionally additional non-metals, where the elements of the alloy are fused together or dissolved into each other when molten. The notation used herein for alloy compositions lists two or more elements using their IUPAC symbols separated by a forward slash ("/"). When given, the proportions of the elements in the alloy are indicated by number after the element corresponding to the weight percent of the element in the alloy. For example, Cu/Sn represents an alloy of Copper (Cu) and tin (Sn), which can be any proportion of these two elements. Cu75/Sn25 represents a specific alloy of copper and tin that contains 75 percent by weight of copper and 25 percent by weight of tin. Where a range is given for the weight percent of an element(s) in an alloy, the range indicates that the element can be present in any amount within the indicated range. For example, Sn(70-90)/Bi(10-30) refers to an alloy containing from 70 weight percent to 90 weight percent of tin, and from 10 weight percent to 30 weight percent of bismuth. Thus, alloys encompassed by the "Sn(70-90)/Bi(10-30)" range include, but are not limited to: Sn70/Bi30, Sn71/Bi29, Sn72/Bi28, Sn73/Bi27, Sn74/Bi26, Sn75/Bi25, Sn76/Bi24, Sn77/Bi23, Sn78/Bi22, Sn79/Bi21, Sn80/Bi20, Sn81/Bi19, Sn82/Bi18, Sn83/Bi17, Sn84/Bi16, Sn85/Bi15, Sn86/Bi14, Sn87/Bi13, Sn88/Bi12, Sn89/Bi11, and Sn90/Bi10. Furthermore, Sn(70-90)/Bi(10-30) represents alloys in which the specific proportion of the elements Sn and Bi may vary from Sn70/Bi30 to Sn90/Bi10 inclusive of proportions of Sn varying from 70 up to 90 weight percent and Bi inversely varying from 30 down to 10 weight percent.

The terms "melting temperature" or "melting point," as used herein, refer to the temperature (a point) at which a solid becomes a liquid at atmospheric pressure.

Unless specified otherwise, the recitation of numerical end points includes all numbers and fractions subsumed within the respective ranges, as well as the recited end points.

All references cited in the present specification are hereby incorporated by reference in their entirety.

Unless otherwise defined, all terms used in the present invention, including technical and scientific terms, have the meaning as commonly understood by one of the ordinary skilled in the art to which this invention belongs.

The present invention is directed to a silver sintering composition comprising:
A. at least one silver filler,
B. at least one copper alloy in an amount of from 0.01% to 20% by weight, based on the total weight of the composition, and
C. a matrix component selected from a resin, a solvent, and a combination thereof.

(A) Silver Filler

The silver sintering composition according to the present invention comprises at least one silver filler.

In preferred embodiments, the silver filler has a D50 particle size of from 0.5 to 6.0 µm, preferably from 0.8 to 5.0 µm, more preferably from 1.0 to 5.0 µm, more preferably from 1.1 to 1.4 µm, and even more preferably from 1.1 to 3.0 µm. When the particle size of the silver filler is within the above range, the fillers are better dispersed in the adhesive composition, which can improve the preservation stability of the adhesive composition and provide a uniform bonding strength. Herein, the "D50 particle size" of the silver filler represents a median diameter in a volume-basis particle size distribution curve obtained by measurement with a laser diffraction particle size analyzer.

In preferred embodiments, the silver particles used in the adhesive composition include particles in which the shape is flake. The filler having such a shape has high contact area between the fillers, which may reduce voids in a cured product. The shape of silver particles is a shape when analyzed from scanning electron microscope (SEM) observation, and Philips XL30 can be used as the observation apparatus of SEM. Examples of the flake particles include particles with a shape called tabular, dished, scaly, and flaky. When flake silver particles are brought into contact with each other, the contact area increases compared with the case where granular silver particles are brought into contact with each other. Therefore, if the adhesive composition containing flake silver particles is heat-cured, the denseness of sintering of silver particles to each other will increase, and as a result, presumably, not only the thermal conductivity and the electrical conductivity of a cured product of the adhesive composition, but also adhesive strength to the surface of a base metal is improved.

In preferred embodiments, the silver filler has a tap density of from 2 to 15 g/cm3, preferably from 3 to 7.5 g/cm3.

The silver filler used in the present invention can be manufactured by a known method such as a reduction method, a milling method, an electrolysis method, an atomization method, or a heat treatment method.

In certain embodiments, the surface of the silver filler may be coated with an organic substance.

Herein, the state where a silver filler is "coated with the organic substance" includes a state where an organic solvent is adhered to the surface of a silver filler by dispersing the silver filler in the organic solvent.

Examples of the organic substance coating the silver filler may include a hydrophilic organic compound such as an alkyl alcohol having 1 to 5 carbon atoms, an alkanethiol having 1 to 5 carbon atoms, and an alkane polyol having 1 to 5 carbon atoms, or a lower fatty acid having 1 to 5 carbon atoms; and a hydrophobic organic compound such as a higher fatty acid having 15 or more carbon atoms and its derivatives, a middle fatty acid having 6 to 14 carbon atoms and its derivatives, an alkyl alcohol having 6 or more carbon atoms, an alkylamine having 16 or more carbon atoms, or an alkanethiol having 6 or more carbon atoms.

Examples of the higher fatty acid include a straight-chain saturated fatty acid such as pentadecanoic acid, hexadecane acid, heptadecanoic acid, octadecanoic acid, 12-hydroxy octadecanoic acid, eicosanoic acid, docosanoic acid, tetracosanoic acid, hexacosanoic acid (cerinic acid), or octacosanoic acid; a branched saturated fatty acid such as 2-pentyl nonanoic acid, 2-hexyl decanoic acid, 2-heptyl dodecanoic acid, or isostearic acid; and an unsaturated fatty acid such as palmitoleic acid, oleic acid, isooleic acid, elaidic acid, linoleic acid, linolenic acid, recinoleic acid, gadoleic acid, erucic acid, and selacholeic acid.

Examples of the middle fatty acid include a straight-chain saturated fatty acid such as hexanoic acid, heptanoic acid, octanoic acid, nonanoic acid, decanoic acid, undecanoic acid, dodecanoic acid, tridecanoic acid, or tetradecanoic acid; a branched saturated fatty acid such as isohexanoic acid, isoheptanoic acid, 2-ethylhexanoic acid, isooctane acid, isononanoic acid, 2-propyl heptanoic acid, isodecanoic acid, isoundecanoic acid, 2-butyl octanoic acid, isododecanoic acid, and isotridecanoic acid; and an unsaturated fatty acid such as 10-undecenoic acid.

Examples of a method for manufacturing a silver filler having a surface coated with an organic substance include, but are not particularly limited to, a method for manufacturing a silver filler in the presence of an organic solvent by a reductive method. Specifically, the silver filler can be obtained by mixing a carboxylic acid silver salt with a primary amine, and depositing a conductive filler using a reducing agent in the presence of an organic solvent.

It is possible to use commercially available silver fillers in the present invention. Examples thereof include TC-505C available from Tokuriki Chemical Research Co., Ltd., and FA-SAB-238 available from Dowa Hightech.

When the surface of the silver filler is coated with the organic substance, the aggregation of the silver filler in the adhesive composition can be more prevented or reduced.

The silver fillers may be used singly or in combination of two or more. Combination of fillers in different shapes or different sizes may reduce porosity of the cured product. Examples of the combination include, but not limited to, a mixture of a flake-shaped silver filler, and an approximately spherical-shaped silver filler having a central particle diameter smaller than that of the flake-shaped silver filler.

With particular preference, the silver filler may be incorporated in the silver sintering composition in an amount of from 80% to 96% by weight, preferably from 85 to 95% by weight, based on the total weight of the composition.

(B) Copper Alloy

The silver sintering composition comprises at least one copper alloy in an amount of from 0.01% to 20% by weight, based on the total weight of the composition. The inventors have surprisingly found that the incorporation of the copper alloy in sintering compositions can greatly improve the adhesion performance of the silver sintering adhesive on metallic such as copper surface.

In preferred embodiments, the silver sintering composition comprises copper alloy having a melting point of from 200° C. to 1000° C., preferably from 300° C. to 900° C., more preferably from 400° C. to 800° C.

In preferred embodiments, the silver sintering composition comprises the copper alloy having a D50 particle size of from 100 nm to 100 μm, preferably from 0.5 μm to 50 μm, more preferably from 1 μm to 25 μm.

There is no limitation on the type of the copper alloy as long as it comprises not more than 95 wt % copper (Cu), preferably from 20 to 90 wt % copper (Cu), more preferably from 28 to 90 wt % copper (Cu), more preferably from 73 to 90 wt % copper (Cu), and even more preferably from 60 to 90 wt % copper (Cu), based on the weight of the alloy.

In preferred embodiments, the copper alloy comprises at least one metal from tin (Sn), silver (Ag), zinc (Zn), gold (Au), bismuth (Bi), lead (Pb), manganese (Mn), iron (Fe), nickel (Ni), indium (In), cadmium (Cd), cobalt (Co), arsenic (As), aluminum (Al), silicon (Si) and antimony (Sb), preferably Sn, Ag, Pb, and Zn.

It is possible to use commercially available products in the present invention. Examples thereof include Cu(20-97)/Sn(3-80), such as Cu90/Sn10, Cu75/Sn25, Cu60/Sn40, and Sn80/Cu20; Cu(57-65)/Pb(35-43), such as Cu62/Pb38; Cu(20-60)/Ag(40-80), such as Ag72/Cu28; Cu(64-70)/Zn(24-31)/Ni(5-6), such as Cu64/Zn31/Ni5, Cu70/Zn24/Ni6; Cu(60-70)/Sn(25-38)/Ag(2-5), such as Cu73/Sn23/Ag4, all available from 5N Plus Inc.

According to the invention, the copper alloy incorporated in the silver sintering composition is in an amount of from 0.01% to 20% by weight, preferably from 0.01 to 10% by weight, preferably from 1.5 to 7.0% by weight, more preferably from 2.5 to 5.0%, based on the total weight of the composition.

(C) Matrix Component

The silver sintering composition further comprises a matrix component selected from a resin, a solvent, and combination thereof.

Resin

In some embodiments, the silver sintering composition comprises at least one resin to improve one or more performance properties such as, for example, tackiness, wetting ability, flexibility, work life, high temperature adhesion, and/or resin-filler compatibility prepared from invention compositions. In addition, the resin component(s) are provided in the compositions described herein to improve one or more performance properties such as, for example, rheology, dispensability prepared from invention compositions.

If present, the resin can be thermosetting resin or thermoplastic resin which is capable of imparting one or more of the above-listed properties to the compositions. Such thermosetting resin or thermoplastic resin includes, but not limited to an acetal, an (meth)acrylic monomer, oligomer, or polymer, an acrylonitrile-butadiene-styrene (ABS) polymer or copolymer or a polycarbonate/ABS alloy, an alkyd, a butadiene, a styrene-butadiene, a cellulosic, a coumarone-indene, a cyanate ester, a diallyl phthalate (DAP), an epoxy monomer, oligomer, or polymer, a flexible epoxy or polymer with epoxy functional groups, a fluoropolymer, a melamine-formaldehyde, a neoprene, a nitrile resin, a novolac, a nylon, a petroleum resin, a phenolic, a polyamide-imide, a polyarylate and polyarylate ether sulfone or ketone, a polybutylene, a polycarbonate, a polyester and co-polyestercarbonate, a polyetherester, a polyethylene, a polyimide, a maleimide, a nadimide, an itaconamide, a polyketone, a polyolefin, a polyphenylene oxide, a sulfide, an ether, a polypropylene and polypropylene-EPDM blend, a polystyrene, a polyurea, a polyurethane, a vinyl polymer, rubbers, a silicone polymer, a siloxane polymer, a styrene acrylonitrile, a styrene butadiene latex and other styrene copolymers, a sulfone polymer, a thermoplastic polyester (Saturated), a phthalate, an unsaturated polyester, a urea-formaldehyde, a polyacrylamide, a polyglycol, a polyacrylic acid, a poly(ethylene glycol), an inherently conductive polymer, a fluoropolymer, and the like, as well as combinations of any two or more thereof.

Exemplary maleimides, nadimides, or itaconamides contemplated for use herein include 4,4'-diphenylmethane bismaleimide, 4,4'-diiphenylether bismaleimide, 4,4'diiphenylsulfone bismaleimide, phenylmethane maleimide, m-phenylene bismaleimide, 2,2'-bis[4-(4-maleimidophenoxy)phenyl]propane, 3,3'-dimethyl-5,5'-diethyl-4,4'-diphenylmethane bismaleimide, 4-methyl-1,3-phenylene bismaleimide, 1,6'-bismaleimide-(2,2,4-trimethyl)hexane, 1,3-bis (3-maleimidophenoxy)benzene, 1,3-bis(4-maleimidophenoxy)-benzene, and the like.

In preferred embodiments, the resin is selected from epoxy, acrylate, isocyanate, cyanate ester, maleimides, polyurethane silicone, and mixtures thereof, more preferably is epoxy resin.

In some embodiments, the epoxy resins can be liquid epoxy resins or solid epoxy resins containing aromatic and/or aliphatic backbones, such as the diglycidyl ether of bisphenol F or the diglycidyl ether of bisphenol A, preferably is liquid epoxy resins. Optionally, the epoxy resin is a flexible epoxy. The flexible epoxy can have a chain length of variable length (e.g., a short chain or a long chain), such as a short-chain length or long-chain length polyglycol diepoxide liquid resin. In the adhesive composition with epoxy resins, upon heating the composition at temperatures around 150° C., the epoxy resins self-crosslink and cure. Heating the composition can occur by any known heating mechanism including, but not limited to, conventional furnaces and ovens and microwave ovens, such as those that rely on variable frequency microwave radiation. It is understood by those skilled in the art that other chemical components including, but not limited to, amine- and/or carboxy-containing compounds, may be incorporated into the adhesive component to crosslink with the epoxy resins.

In certain embodiments, epoxies contemplated for use herein include diglycidyl ether of bisphenol A epoxy resin, of diglycidyl ether of bisphenol F epoxy resin, epoxy novolac resins, epoxy cresol resins, and the like.

In some embodiments, the epoxy resins can be toughened epoxy resins, such as epoxidized carboxyl-terminated butadiene-acrylonitrile (CTBN) oligomers or polymers, epoxidized polybutadiene diglycidylether oligomers or polymers, heterocyclic epoxy resins (e.g., isocyanate-modified epoxy resins), and the like.

In certain embodiments, the epoxy resin contemplated for use herein includes a rubber or elastomer-modified epoxy. Rubber or elastomer-modified epoxies include epoxidized derivatives of:
(a) homopolymers or copolymers of conjugated dienes having a weight average molecular weight (Mw) of 30,000 to 400,000 or higher as described in U.S. Pat. No. 4,020,036 (the entire contents of which are hereby incorporated by reference herein), in which conjugated dienes contain from 4-11 carbon atoms per molecule (such as 1,3-butadiene, isoprene, and the like);
(b) epihalohydrin homopolymers, a copolymer of two or more epihalohydrin monomers, or a copolymer of an epihalohydrin monomer(s) with an oxide monomer(s) having a number average molecular weight (Mn) which varies from about 800 to about 50,000, as described in U.S. Pat. No. 4,101,604 (the entire contents of which are hereby incorporated by reference herein);
(c) hydrocarbon polymers including ethylene/propylene copolymers and copolymers of ethylene/propylene and at least one nonconjugated diene, such as ethylene/propylene/hexadiene/norbornadiene, as described in U.S. Pat. No. 4,161,471; or
(d) conjugated diene butyl elastomers, such as copolymers consisting of from 85 to 99.5% by weight of a C4 -05 olefin combined with about 0.5 to about 15% by weight of a conjugated multi-olefin having 4 to 14 carbon atoms, copolymers of isobutylene and isoprene where a major portion of the isoprene units combined therein have conjugated diene unsaturation (see, for example, U.S. Pat. No. 4,160,759; the entire contents of which are hereby incorporated by reference herein).

In certain embodiments, the epoxy resin is an epoxidized polybutadiene diglycidylether oligomer or polymer.

In some embodiments, additional epoxy materials can be a wide variety of epoxy-functionalized resins are contemplated for use herein, e.g., epoxy resins based on bisphenol A (e.g., Epon Resin 834), epoxy resins based on bisphenol F (e.g., RSL-1739 or JER YL980), multifunctional epoxy resins based on phenol-novolac resin, dicyclopentadiene-type epoxy resins (e.g., Epiclon HP-7200L), naphthalene-type epoxy resins, and the like, as well as mixtures of any two or more thereof.

Optionally, the epoxy resin can be a copolymer that has a backbone that is a mixture of monomeric units (i.e., a hybrid backbone). The epoxy resin can include straight or branched chain segments. In certain embodiments, the epoxy resin can be an epoxidized silicone monomer or oligomer. Optionally, the epoxy resin can be a flexible epoxy-silicone copolymer. Exemplary flexible epoxy-silicone copolymers contemplated for use herein include ALBIFLEX 296 and ALBIFLEX 348, both commercially available from Evonik Industries (Germany).

In some embodiments, one epoxy monomer, oligomer, or polymer is present in the composition. In certain embodiments, combinations of epoxy monomers, oligomers, or polymers are present in the composition. For example, two or more, three or more, four or more, five or more, or six or more epoxy monomers, oligomers, or polymers are present in the composition. Combinations of epoxy resins can be selected and used to achieve the desired properties for films or pastes prepared from the compositions. For example, combinations of epoxy resins can be selected such that films prepared from the compositions exhibit one or more of the following improved properties: film quality, tackiness, wetting ability, flexibility, work life, high temperature adhesion, resin-filler compatibility, sintering capability, and the like. Combinations of epoxy resins can be selected such that pastes prepared from the compositions exhibit one or more improved properties such as rheology, dispensability, work life, sintering capability, and the like.

The compositions described herein can further include an acrylic monomer, polymer, or oligomer. Acrylates contemplated for use in the practice of the present invention are well known in the art. See, for example, U.S. Pat. No. 5,717,034, the entire contents of which are hereby incorporated by reference herein.

Exemplary (meth)acrylates contemplated for use herein include monofunctional (meth)acrylates, difunctional (meth)acrylates, trifunctional (meth)acrylates, polyfunctional (meth)acrylates, and the like, as well as mixtures of any two or more thereof.

Additional thermosetting resin or thermoplastic resin components contemplated for use in the compositions described herein can include polyurethanes, cyanate esters, polyvinyl alcohols, polyesters, polyureas, polyvinyl acetal resins, and phenoxy resins. In some embodiments, the compositions can include imide-containing monomers, oligomers, or polymers, such as maleimides, nadimides, itaconimides, bismaleimides, or polyimides.

In one particular embodiment, the thermosetting or thermoplastic resin component is selected from epoxy monomer, epoxy oligomer, epoxy polymer, (meth)acrylic monomer, (meth)acrylic oligomer, (meth)acrylic polymer, phenol-formaldehyde resin, polyurethane, cyanate ester, polyvinyl alcohol, a polyester, polyurea, polyvinyl acetal resin, phenoxy resin, maleimide, bismaleimide, nadimide, itaconamide, polyimide, and mixture thereof. Preferably, the thermosetting or thermoplastic resin component is selected from epoxy monomer, epoxy oligomer, epoxy polymer, (meth) acrylic monomer, (meth)acrylic oligomer, (meth)acrylic polymer, maleimide, bismaleimide, and mixture thereof.

It is possible to use commercially available products in the present invention. Examples thereof include Dodecenylsuccinic Anhydride available from Broadview Technologies, cycloaliphatic glycidyl ester, ERISYS RDGE available from CVC Specialties, Poly bd® 605E available from Total Group, Silquest A-186 silane, Silquest A-187 available from Momentive Performance Materials.

Solvent

When the silver sintering composition comprises a resin, solvent is not a necessary component in the present invention, but it may be added to decrease the viscosity of the adhesive composition. While the silver sintering composition is absence of resin, solvent is needed to disperse the silver fillers in the adhesive composition.

Most silver fillers are provided commercially with a coating of organic substances to prevent agglomeration. The organic substances can hinder sintering, which means that higher temperatures would be needed for sintering. The solvent acts to dissolve or displace the organic substances off the surface of the silver filler. The solvent must have a balance of polarity effective to remove the coatings and allow the silver to remain dispersed in the solvent until dispensed and sintered. Typical organic substances used by manufactures of silver flake include stearic acid, isosteric acid, lauric acid, decanoic acid, decanoic acid, oleic acid, palmitic acid, or fatty acids neutralized with amines such as imidazoles. And effective solvent is one that will remove these, and other such, lubricants from the surface of the silver filler.

There is no limitation on the type of the solvent as long as it has a flash point of more than 70° C., preferably more than 90° C., more preferably more than 120° C. The solvent can be selected from the group consisting of 2-(2-ethoxyethoxy)-ethyl acetate, propylene glycol monoethyl ether, butylethoxy ethyl acetate, propylene carbonate, cyclooctenone, cycloheptanone, cyclohexanone, linear or branched alkanes, and a mixture thereof.

It is possible to use commercially available products in the present invention. Examples thereof include diisobutyl adipate available from Sinopharm Chemical Reagent Co., Ltd, and 2-(2-butoxyethoxy) ethyl acetate available from BASF.

In preferred embodiments, the silver sintering composition comprises a matrix component containing both resin and solvent.

With particular preference, the matrix component selected from a resin, a solvent, and combination thereof may be incorporated into the silver sintering composition in an amount of not more than 15% by weight, preferably from 2 to 10% by weight, based on the total weight of the composition.

(D) Additive

Other commonly used additives may be further added to the silver sintering compositions. Such common additives include fluxing agent, peroxide, flow additives, adhesion promoters, rheology modifiers, toughening agents, and mixture thereof.

With particular preference, the additives may be optionally incorporated into the silver sintering composition in an amount of not more than 2% by weight, based on the total weight of composition.

In another aspect of the invention, sintered product of the conductive composition according to this invention is provided.

The sintering compositions described herein are prepared at room temperature. When used in semiconductor fabrication, these compositions have sufficient adhesion upon sintering to adhere metal coated dies to metal coated substrates. In particular, the compositions can be used to adhere silver or gold coated semiconductor dies to copper lead-frames. In some embodiments the compositions of this invention will sinter at temperatures of from 150° C. to 300° C., preferably from 200° C. to 250° C. No pressure is needed to induce the sintering. At sintering temperatures, the solvent (if any), the additives such as the peroxide, or fluxing agent (if any) and the organic substances contained in the silver fillers used in the composition are burned off, leaving only the sintered product comprising the sintered silver and the copper alloy.

In another aspect of the invention, provided is an assembly comprising a first substrate, a sintered product of this invention and a second substrate selected from copper, gold or silver, wherein the sintered product is dispensed between the first substrate and the second substrate.

In yet another aspect of the invention, the use of the sintering composition of this invention in the manufacturing of semiconductor packages or touch screen is provided.

In yet another aspect of the invention, the use of the sintered product of this invention in semiconductor packages and microelectronic devices touch screen is provided.

EXAMPLES

The following examples are intended to assist one skilled in the art to better understand and practice the present invention. The scope of the invention is not limited by the examples but is defined in the appended claims. All parts and percentages are based on weight unless otherwise stated.

Raw Materials

TC-505C Silver Powder is available from Tokuriki Chemical Research Co., Ltd.

Silver Powder FA-SAB-238 is available from Dowa Hightech.

Dodecenylsuccinic Anhydride is anhydride resin available from Broadview Technologies.

Epalloy™ 5200 is cycloaliphatic glycidyl ester available from CVC Specialties.

ERISYS RDGE is epoxy resin available from CVC Specialties.

Poly bd® 605E is epoxy functional poly butadiene resin available from Total Group.

Silquest A-186 silane is silane resin available from Momentive Performance Materials.

Silquest A-187 silane is silane resin available from Momentive Performance Materials.

Diisobutyl Adipate is solvent available from Sinopharm Chemical Reagent Co., Ltd.

2-(2-butoxyethoxy) ethyl acetate is solvent available from BASF.

Cu75/Sn25 is copper alloy consisting of 75 wt % Cu and 25 wt % Sn with melting point of about 800° C., available from 5N Plus Inc.

Ag72/Cu28 is copper alloy consisting of 28 wt % Cu and 72 wt % Ag with melting point of about 780° C., available from 5N Plus Inc.

Cu90/Sn10 is copper alloy consisting of 90 wt % Cu and 10 wt % Sn with melting point of about 860° C., available from 5N Plus Inc.

Cu60/Sn40 is copper alloy consisting of 60 wt % Cu and 40 wt % Sn with melting point of about 725° C., available from 5N Plus Inc.

Cu73/Sn23/Ag4 is copper alloy consisting of 72.5 wt % Cu, 3.5 wt % Ag, 22.5 wt % Sn, 0.1 wt % Fe, 0.3 wt % As, 0.3 wt % Sb, 0.3 wt % Bi and 0.5 wt % with melting point of about 645° C., available from 5N Plus Inc.

Sn80/Cu20 is copper alloy consisting of 20 wt % Cu and 80 wt % Sn with melting pointing of about 480° C., available from 5N Plus Inc.

Preparation Method

In the following examples, the samples were prepared by mixing and stirring at 1000 rpm in Speedmixer® at a temperature of below 30° C., preferably at room temperature to obtain a homogeneous composition paste. Then all samples were used to be sintered at 5° C./min to 130° C. for 30 minutes and then 5° C./min to 220° C. for 60 mins at N2 atmosphere. No pressure was used.

Test Methods

Die Shear Strength

Die Shear Strength (DSS) was measured using DAGE4000 with a heater adapter plate capable of reaching 260° C. The compositions were coated onto 2×2 mm2 silver coated dies and employed to a commercial type of copper lead-frame (CDA151) used in the semiconductor industry. The samples were sintered according to the sintering profile stated above. Each sample was tested eight times under the same condition and the average die shear strength was calculated and recorded by simplistic average method so as to eliminate error. The average die shear strength target was greater than or equal to 4.0 Kg/mm2.

Examples 1 to 4 and Comparative Example 1

In this set of examples, one silver sintering composition comprising resin but without copper alloy (CE.1) and four compositions comprising copper alloy in different contents according to this invention (EX.1 to EX.4) were prepared based on weight percentage specified in the following table. The die shear strength of the samples employed to copper lead-frame (CDA151) were tested.

| Component | CE. 1 | EX. 1 | EX. 2 | EX. 3 | EX. 4 |
|---|---|---|---|---|---|
| TC-505C Silver Powder | 91.61 | 90.41 | 89.31 | 87.02 | 84.74 |
| Dodecenyl-succinic Anhydride | 3.29 | 3.25 | 3.21 | 3.13 | 3.04 |
| Epalloy ™ 5200 | 0.88 | 0.87 | 0.86 | 0.84 | 0.81 |
| ERISYS RDGE | 0.88 | 0.87 | 0.86 | 0.84 | 0.81 |
| Poly bd ® 605E | 1.53 | 1.51 | 1.49 | 1.45 | 1.42 |
| Silquest A-186 | 0.18 | 0.18 | 0.18 | 0.17 | 0.17 |
| Silquest A-187 | 0.18 | 0.18 | 0.18 | 0.17 | 0.17 |
| Diisobutyl Adipate | 1.45 | 1.43 | 1.41 | 1.38 | 1.34 |
| Cu75/Sn25 | — | 1.3 | 2.5 | 5.0 | 7.5 |
| Testing result | | | | | |
| Average DSS/Kg | 3.1 | 5.6 | 6.1 | 6.2 | 5.8 |

Example 5 and Comparative Example 2

In this set of examples, one silver sintering composition in the absence of resin and without comprising copper alloy (CE.2) and one silver sintering composition with copper alloy according to this invention (EX.5) were prepared based on weight percentage specified in the following table. The die shear strength of the samples employed to Cu-lead frame of Type 2 were tested respectively.

| Component | CE. 2 | EX. 5 |
|---|---|---|
| Silver Powder FA-SAB-238 | 90.4 | 88.1 |
| 2-(2-butoxyethoxy) ethyl acetate | 9.6 | 9.4 |
| Ag72/Cu28 | — | 2.5 |
| Testing result | | |
| Average DSS/Kg | 7.7 | 10.3 |

Examples 6 to 11 and Comparative Example 3

In this set of examples, one silver sintering composition in the absence of resin and without comprising copper alloy (CE.3) and six silver sintering compositions with different types of copper alloy according to this invention (EX.6 to EX.11) were prepared based on weight percentage specified in the flowing table. The die shear strength of the samples employed to Cu-lead frame of Type 2 were tested.

| Component | CE. 3 | EX. 6 | EX. 7 | EX. 8 | EX. 9 | EX. 10 | EX. 11 |
|---|---|---|---|---|---|---|---|
| TC-505C Silver Powder | 89.31 | 89.31 | 89.31 | 89.31 | 89.31 | 89.31 | 89.31 |
| Dodecenylsuccinic Anhydride | 3.21 | 3.21 | 3.21 | 3.21 | 3.21 | 3.21 | 3.21 |
| Epalloy ™ 5200 | 0.86 | 0.86 | 0.86 | 0.86 | 0.86 | 0.86 | 0.86 |
| ERISYS RDGE | 0.86 | 0.86 | 0.86 | 0.86 | 0.86 | 0.86 | 0.86 |
| Poly bd ® 605E | 1.49 | 1.49 | 1.49 | 1.49 | 1.49 | 1.49 | 1.49 |
| Silquest A-186 | 0.18 | 0.18 | 0.18 | 0.18 | 0.18 | 0.18 | 0.18 |
| Silquest A-187 | 0.18 | 0.18 | 0.18 | 0.18 | 0.18 | 0.18 | 0.18 |
| Diisobutyl Adipate | 1.41 | 1.41 | 1.41 | 1.41 | 1.41 | 1.41 | 1.41 |
| Cu75/Sn25 | — | 2.5 | — | — | — | — | — |
| Cu90/Sn10 | — | — | 2.5 | — | — | — | — |
| Cu60/Sn40 | — | — | — | 2.5 | — | — | — |
| Cu73/Sn23/Ag4 | — | — | — | — | 2.5 | — | — |
| Ag72/Cu28 | — | — | — | — | — | 2.5 | — |
| Sn80/Cu20 | — | — | — | — | — | — | 2.5 |
| Testing result | | | | | | | |
| Average DSS/Kg | 4.0 | 6.5 | 6.6 | 9.5 | 7.6 | 7.3 | 7.9 |

The above results of three sets of Examples showed a higher average die shear strength on copper lead-frame for the compositions containing copper alloy than that of containing no copper alloy, regardless of pure silver sintering adhesive in absence of resin or silver sintering adhesive containing resin.

Figure 2:
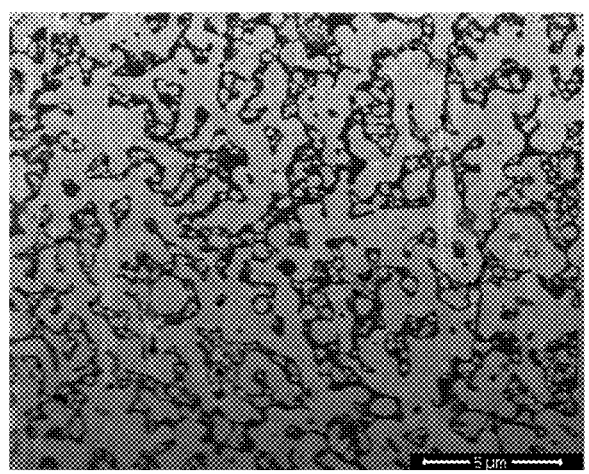
FIG. 2 shows a SEM photo with the magnification ratio of 5000 of cell structure of semi-sintering composition according to Example 6.

As can be seen from Figures, the copper alloy increased the diffusion of silver particles for silver sintering matrix (in FIG. 1) and semi-sintering matrix (in FIG. 2), which can improve the adhesion on metal substrate.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A silver sintering composition, comprising:
   (A) at least one silver filler;
   (B) at least one copper alloy in an amount of from 0.01% to 20% by weight, based on the total weight of the composition; and
   (C) a matrix component selected from a resin, a solvent, or any combination thereof,
   wherein the copper alloy comprises 20 to 90 wt % copper, based on the total weight of the copper alloy, and
   wherein the copper alloy has a melting point of from 300° C. to 900° C.

2. The composition according to claim 1, wherein the silver filler has a $D_{50}$ particle size of from 0.5 to 6.0 μm.

3. The composition according to claim 1, wherein the silver filler has a tap density of from 2 to 15 g/cm$^3$.

4. The composition according to claim 1, wherein the copper alloy comprises at least one metal selected from the group consisting of tin (Sn), silver (Ag), zinc (Zn), gold (Au), bismuth (Bi), lead (Pb), manganese (Mn), iron (Fe), nickel (Ni), indium (In), cadmium (Cd), cobalt (Co), arsenic (As), aluminum (Al), silicon (Si), and antimony (Sb).

5. The composition according to claim 1, wherein the resin is selected from the group consisting of epoxy acrylate, isocyanate, cyanate ester, maleimides, polyurethane silicon, and any mixture thereof.

6. The composition according to claim 1, wherein the solvent has a flash point of more than 70° C.

7. The composition according to claim 1, wherein the silver filler is present in an amount of from 80% to 96% by weight, based on the total weight of the composition.

8. The composition according to claim 1, wherein the copper alloy is present in an amount of from 0.01 to 10% by weight, based on the total weight of the composition.

9. The composition according to claim 1, wherein the matrix component is present in an amount of from 2 to 10% by weight, based on the total weight of the composition.

10. The composition according to claim 1, wherein the composition further comprises an additive selected from the group consisting of a fluxing agent, a peroxide, flow additives, adhesion promoters, rheology modifiers, toughening agents, and any mixture thereof.

11. The composition according to claim 10, wherein the additive is present in an amount of from 0.5% to 2% by weight, based on the total weight of composition.

12. A sintered product comprising the silver sintering composition according to claim 1.

13. An assembly comprising:
    (i) a first substrate of silver;
    (ii) the sintered product according to claim 12; and
    (iii) a second substrate comprising copper, gold, or silver,
    wherein the sintered product is between the first substrate and the second substrate.

14. The assembly of claim 13, wherein the assembly is a semiconductor package or a touch screen.

15. The composition according to claim 1, wherein the copper alloy comprises copper and another metal fused together or dissolved into each other when molten.

16. The composition according to claim 1, wherein the copper alloy comprises 60 to 90 wt % copper, based on the total weight of the copper alloy.

17. The assembly according to claim 13, wherein the assembly has an average die shear strength greater than or equal to 4.0 Kg/mm$^2$.

18. The composition according to claim 8, wherein the copper alloy is present in an amount of from 2.5 to 5.0% by weight, based on the total weight of the composition.

19. The composition according to claim 2, wherein the silver filler has a $D_{50}$ particle size of from 1.1 to 3.0 μm.

* * * * *